United States Patent [19]

Bosselaers

[11] 3,913,028

[45] Oct. 14, 1975

[54] PHASE LOCKED LOOP INCLUDING AN ARITHMETIC UNIT

[75] Inventor: Robert Jan Bosselaers, Winchester, Mass.

[73] Assignee: RCA Corporation, New York, N.Y.

[22] Filed: Apr. 22, 1974

[21] Appl. No.: 462,772

[52] U.S. Cl. .................... 331/1 A; 307/271; 328/14

[51] Int. Cl.² .................... H03B 3/04

[58] Field of Search ........ 331/1 A; 328/14; 307/271

[56] References Cited

UNITED STATES PATENTS

| | | | |
|---|---|---|---|
| 3,551,826 | 12/1970 | Sepe | 331/1 A |
| 3,555,446 | 1/1971 | Braymer | 331/1 A |
| 3,651,422 | 3/1972 | Underhili | 331/1 A |
| 3,689,849 | 9/1972 | Swanson et al. | 331/1 A |
| 3,824,483 | 7/1974 | Margala et al. | 331/1 A |

*Primary Examiner*—John Kominski
*Attorney, Agent, or Firm*—Edward J. Norton; Carl M. Wright; Joseph S. Tripoli

[57] ABSTRACT

A phase locked loop includes an arithmetic unit to add a first number (N1) to the contents of a storage register, included in the arithmetic unit, at a reference frequency ($f_R$), and to subtract a second number (N2) from the contents of the storage register at a variable frequency ($f_V$). The storage register is coupled to a voltage controlled oscillator which generates the variable frequency $f_V$ in accordance with the contents of the storage register. When the total of the additions of the nubmer N1 equals the total of the subtractions of the number N2 over a period of time, the contents of the storage register will remain substantially constant, and accordingly, variable frequency $f_V$ will equal a frequency directly proportional to N1/N2 $f_R$.

In a preferred embodiment, the values of N1 and N2 may be selectively programmed.

16 Claims, 5 Drawing Figures

PHASE LOCKED LOOP INCLUDING AN ARITHMETIC UNIT

BACKGROUND OF THE INVENTION

1. Field of the Invention

This invention pertains to the field of frequency synthesizers, and particularly pertains to frequency synthesizers utilizing a phase locked loop.

2. Description of the Prior Art

Frequency synthesizers are known in the art for generating a range of frequencies, programmable in discrete increments, from a single, stable and accurate frequency standard. The typical frequency synthesizer utilizes a phase locked loop because phase locked loops are capable of locking with precision on a programmed frequency.

Phase locked loops are also well known in the art and generally include a voltage controlled oscillator for generating a frequency variable AC signal whose frequency varies in response to a DC control voltage. A portion of the variable AC signal is taken as the output signal of the phase locked loop. Another portion of the variable AC signal is coupled to one input of a phase detector through a programmable frequency divider. The frequency divider is programmed by selecting the divisor of the frequency divider. The other input of the phase detector is coupled to a frequency standard which generates a reference AC signal having a stable and accurate reference frequency. The phase detector generates an error signal manifesting the difference between the phase of the reference AC signal and the phase of the variable AC signal. The output of the phase detector is coupled to a suitable means for converting the error signal to a DC voltage. The DC voltage is coupled to the voltage controlled oscillator as the DC control voltage to control the frequency of the variable AC signal. As long as the phase of the AC reference signal and the phase of the variable AC signal are not equal, an error signal is generated by the phase detector to change the frequency of the voltage controlled oscillator. When the difference between the phase of the reference frequency and the phase of the variable AC signal is substantially reduced to zero, as manifested by the error signal, the phase locked loop is in the locked condition wherein the voltage controlled oscillator oscillates at the desired programmed frequency. Thus, the frequency of the typical prior art phase locked loop is programmed by selecting the divisor of the programmable frequency divider.

A typical phase locked loop, and the various components comprising the phase locked loop, are described in an article entitled "FREQUENCY SYNTHESIZING WITH THE PHASE LOCKED LOOP," by E. Renschler and B. Welling, which appears in the June 1970 issue of The Electronic Engineer.

In phase locked loops of the type described above, a filter, at times known as the "loop filter, " is provided between the phase detector and the voltage controlled oscillator to remove any unwanted AC components from the DC control signal to inhibit the generation of jitter in the variable AC signal. The bandwidth of the loop filter is chosen sufficiently narrow to filter out unwanted AC frequency components from the DC control signal. However, the narrower the bandwidth of the loop filter, the more difficult it is to bring the loop into a locked condition since a narrow bandwidth loop filter inhibits all but relatively small variations in the error signal, thereby limiting the range of frequencies generated by the voltage controlled oscillator and reducing the possibility of locking the phase locked loop. Thus, if the voltage controlled oscillator is operating at a frequency outside of the frequency range determined by the error signal, locking is difficult if not impossible to achieve. In effect, then, a narrow bandwidth loop filter undesirably limits the lock or acquisition range of a phase locked loop.

As is known, the limited acquisition range of a prior art phase locked loop including a narrow bandwidth loop filter may be expanded by the use either of a "search oscillator" or a "pretuning circuit." A "search oscillator" is a low frequency oscillator coupled to the control input of the voltage controlled oscillator to periodically sweep the output frequency of the voltage controlled oscillator through a relatively wide range of frequency in comparison to the range of frequencies that would normally be determined by the error signal alone. Once the frequency of the voltage controlled oscillator is brought approximately close to the frequency required to lock the phase locked loop by the search oscillator, the error signal is sufficient to lock the loop precisely. A "pretuning circuit" is basically a programmable voltage source, coupled to the control input of the voltage controlled oscillator and is programmed at the same time as is the frequency divider to apply a voltage to the voltage controlled oscillator to cause the voltage controlled oscillator to oscillate approximately close to the frequency required to lock the phase locked loop such that the error signal is sufficient to lock the loop precisely. Thus, in effect, both the search oscillator and the pretuning circuit provide a coarse control to bring the phase locked loop approximately close to a lock condition such that the error signal acts as a vernier to lock the loop precisely.

Search oscillators and pretuning circuits in phase locked loops are undesirable, however, since they are only partially effective to increase the acquisition range of the phase locked loop while adding complexity and cost to the phase locked loop.

Nevertheless, as also known in the prior art, phase detectors are available which tend to increase somewhat the acquisition range of phase locked loops including narrow bandwidth loop filters. For instance, in "USE IC'S IN YOUR PHASE LOCKED LOOP," an article written by W. L. Gill and A. D. Ogden, appearing in the Apr. 11, 1968 issue of "Electronic Design," and Motorola Application Note AN-532A published in 1971, there are described phase detectors which provide relatively wide acquisition ranges and therefore eliminate the requirement of a search oscillator or a pretuning circuit in phase locked loops utilizing these detectors. Although phase locked loops including such phase detectors have increased acquisition ranges, the frequency resolution of these phase detectors is undesirably limited.

Prior art phase locked loops have limited frequency resolution since the smallest programmable increment is equal to the reference frequency because the programmable frequency divider can generally only be programmed to divide by integer numbers. That is, since the lowest programmable divisor in most prior art phase locked loops is 1, frequencies may only be programmed in increments equal to the reference frequency.

The resolution of prior art phase locked loops may be improved by the use of a low frequency reference AC signal. However, if the reference frequency is lowered to achieve better frequency resolution, two problems arise. First, the settling time, that is, the time required for the loop to operate properly at the programmed frequency (typically equal approximately to 20–30 periods of the reference frequency), is too long for many applications. Second, any phase jitter present in the frequency standard providing the reference AC signal is multiplied by the programmed divisor of the frequency divider thereby decreasing the spectral purity of the output AC signal of the phase locked loop. For very large programmed divisors, the phase jitter becomes intolerable for most applications. Thus, there must be a compromise in most prior art phase locked loops between frequency resolution and spectral purity.

The Digiphase Synthesizer, described in an article entitled "THE DIGIPHASE SYNTHESIZER," by Garry C. Gillette, appearing in the Aug. 19, 1969 volume 9, Number 8, issue of "Frequency Technology" is a phase locked loop which has provisions for programming a frequency divider in fractional ratios. That is, the frequency of the Digiphase Synthesizer may be incremented in fractions of the reference frequency and, thus, high frequency resolutions may be achieved without lowering the reference frequency.

However, because the Digiphase Synthesizer utilizes a type of phase detector providing only a limited acquisition range, the Digiphase Synthesizer requires a search oscillator, pretuning circuit, or the like. In addition, the programmable fractional ratio divider of the Digiphase Synthesizer is clocked by the output of the voltage controlled oscillator. Since programmable frequency dividers cannot readily be operated at high frequencies (typically no higher than 200 MHz) the upper frequency of the frequency range of the Digiphase Synthesizer phase locked loop is relatively low (limited to 200 MHz).

In addition, because the Digiphase Synthesizer produces undesirable beat frequencies, a somewhat complex analogue circuit is included in the Digiphase Synthesizer to remove these beat frequencies. It should be noted that this analogue circuit, although satisfactory to remove most of the beat frequency components, is not perfect and may not be sufficient for some applications. It is desirable that a phase locked loop not generate beat frequencies so that complex circuitry which increases the cost of the phase locked loop, and which may not be fully effective, is not required.

Thus, there is a need in the art for a phase locked loop programmable over a wide range of frequencies, extending into the GHz range without generating beat frequencies, having high frequency resolution without sacrificing short settling times and having a relatively wide acquisition range without sacrificing the capability of inhibiting jitter and suppressing noise.

SUMMARY OF THE INVENTION

According to the invention, an arithmetic unit is included in a phase locked loop to add a first preselected number (N1) to the contents of a storage register, included within the arithmetic unit, at a rate equal to a reference frequency ($f_R$) and to subtract a second preselected number (N2) from the contents of the storage register at a rate equal to a variable frequency ($f_V$). Means are provided to vary the variable frequency ($f_V$) in response to the contents of the storage register. The contents of the storage register remains substantially constant when the aggregate of the additions of the first preselected number (N1) to the contents of the storage register and the aggregate of the subtractions of the second preselected number (N2) from the contents of the storage register in a period of time are equal. When the contents of the storage register remain substantially constant, the variable frequency is equal to the product of the ratio of the first and second selected numbers and the reference frequency.

$$(f_V = \frac{N1}{N2} f_R).$$

Figure 1:
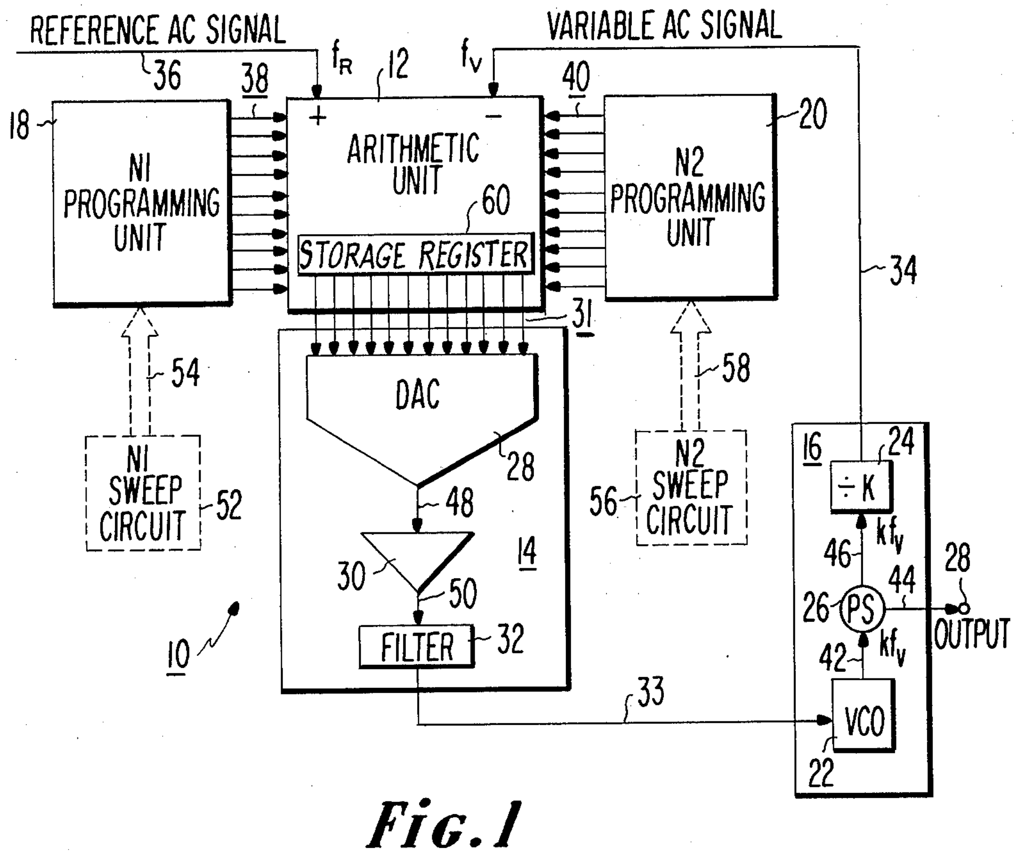
FIG. 1 is a block diagram of a phase locked loop embodying the present invention.

In the drawing, reference numbers appearing in more than one figure refer to the same item. In addition, the input and output of various circuits in the drawing are indicated by the direction of arrows.

DETAILED DESCRIPTION OF THE PREFERRED EMBODIMENT (FIGURE 1)

FIG. 1 is a block diagram of a phase locked loop (PLL) 10 embodying the invention. Phase locked loop 10 of FIG. 1 comprises arithmetic unit 12, digital to analogue converter means 14, and oscillator means 16, providing a frequency variable AC signal at frequency $f_V$. A closed loop is formed by the series connection, in the order named, of the output of arithmetic unit 12, multiconductor path 31, digital to analogue converter 14, conductor 33, oscillator means 16, conductor 34, and the minus (−) input of arithmetic unit 12. The plus (+) input of arithmetic unit 12 is coupled through conductor 36 to a suitable frequency standard, not shown, provided to generate a reference AC signal having a stable and accurate frequency $f_R$. The frequency standard may be a crystal oscillator or the like. A signal manifesting a first number N1 is coupled through multiconductor path 38 to arithmetic unit 12 from programming unit 18 and another signal manifesting a second number N2 is coupled through multiconductor path 40 to arithmetic unit 12 from programming unit 20.

Oscillator means 16 includes a voltage controlled oscillator (VCO) 22 whose output is coupled to frequency divider 24 and output terminal 28 through power splitter (PS) 26. Conductor 42 couples the output of voltage controlled oscillator 22 to power splitter 26. Conductors 44 and 46, respectively, couple the output of power splitter 26 to output terminal 28 and frequency divider 24. Voltage controlled oscillator 22 is a suitable oscillator, of the type well known in the art, whose output frequency is controllable in accordance with a DC control voltage applied to the input of voltage controlled oscillator 22.

Power splitter 26 is a suitable circuit arranged to divide a predetermined portion of the output signal of voltage controlled oscillator 22 between output terminal 28 and the input of frequency divider 24. Many types of power splitters are known in the art, and it should be understood that the particular circuitry forming power splitter 26 is chosen according to the frequency range of phase locked loop 10. An example of a power splitter that may be used in phase locked loop 10 is type DS109 two-way power divider described on page 19 of the Anzac Electronics 1973 catalog.

Frequency divider 24 is a suitable circuit to arrange to divide the frequency of the output signal of voltage controlled oscillator 22 by a fixed number K. Many types of analogue and digital frequency dividers are known in the art; however, it is preferred that frequency divider 24 is of the digital type. The components forming frequency divider 24 should be selected so that frequency divider 24 is capable of dividing relatively high frequency signals. At the present state of the art, digital frequency dividers operating in the range of 1 GHz are available. An example of such a digital frequency divider is the type SP616B digital frequency divider described in the Feb. 1973 Plessey Semiconductors catalog.

As the DC level at the input of voltage controlled oscillator 22 varies, the frequency of the output signal of voltage controlled oscillator 22 varies in a predetermined manner. Thus, the frequency of the output signal of voltage controlled oscillator 22 may vary directly with the level of the DC control signal applied to the input of voltage controlled oscillator 22 or may vary in any other suitable manner. The frequency of the output signal of voltage controlled oscillator 22 is divided by the divisor, K, of frequency divider 24. Thus, if the frequency of the output signal of voltage controlled oscillator 22 is $Kf_V$, the output of oscillator means 16, coupled to the negative (−) input of arithmetic unit 12, has a frequency $f_V$. The symbol $f_V$ is chosen to indicate that the output of oscillator means 16 has a frequency which varies in accordance with the DC control applied to the input of voltage controlled oscillator 22. For the remainder of this specification, the output of oscillator means 16 will be called the "variable AC signal."

Figure 3:
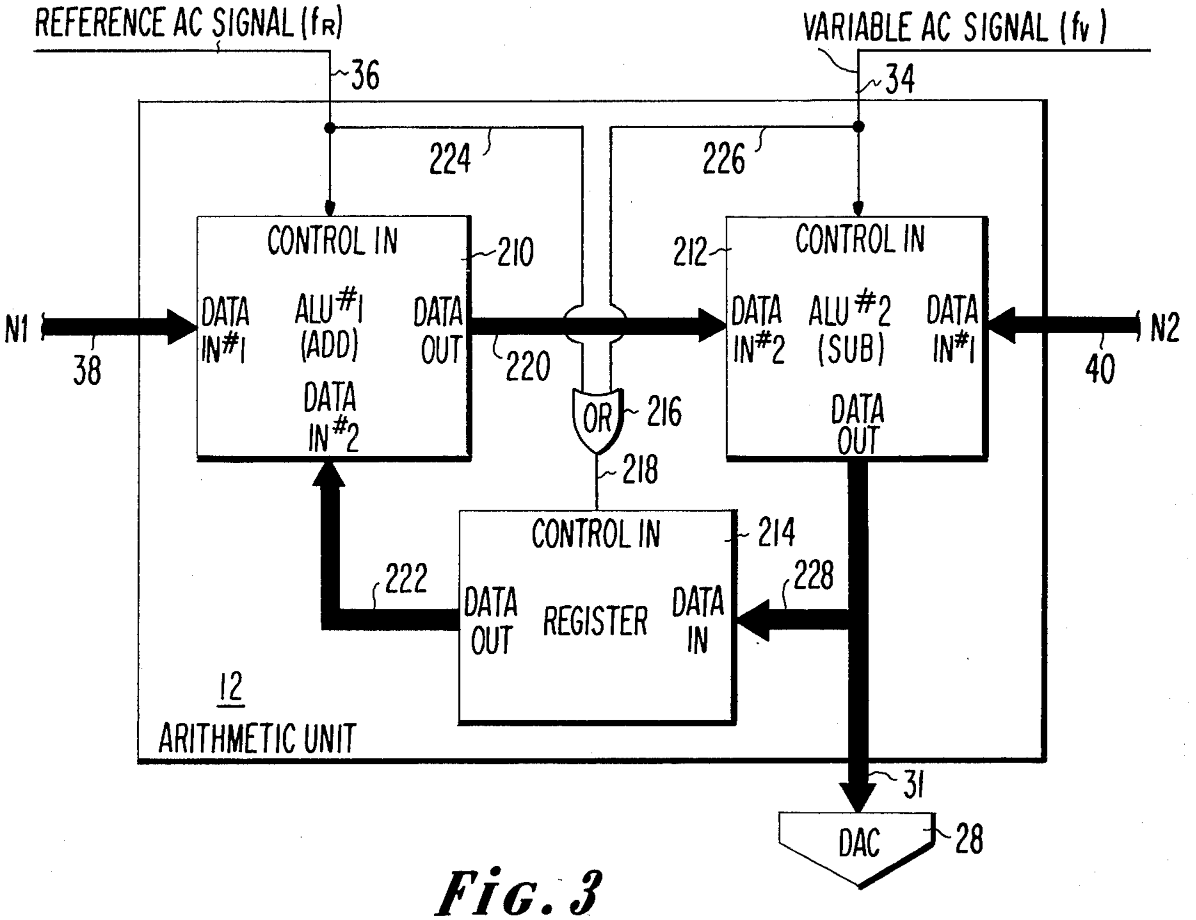
FIG. 3 is a logic diagram of an implementation of the arithmetic unit of FIG. 1.
Figure 4:
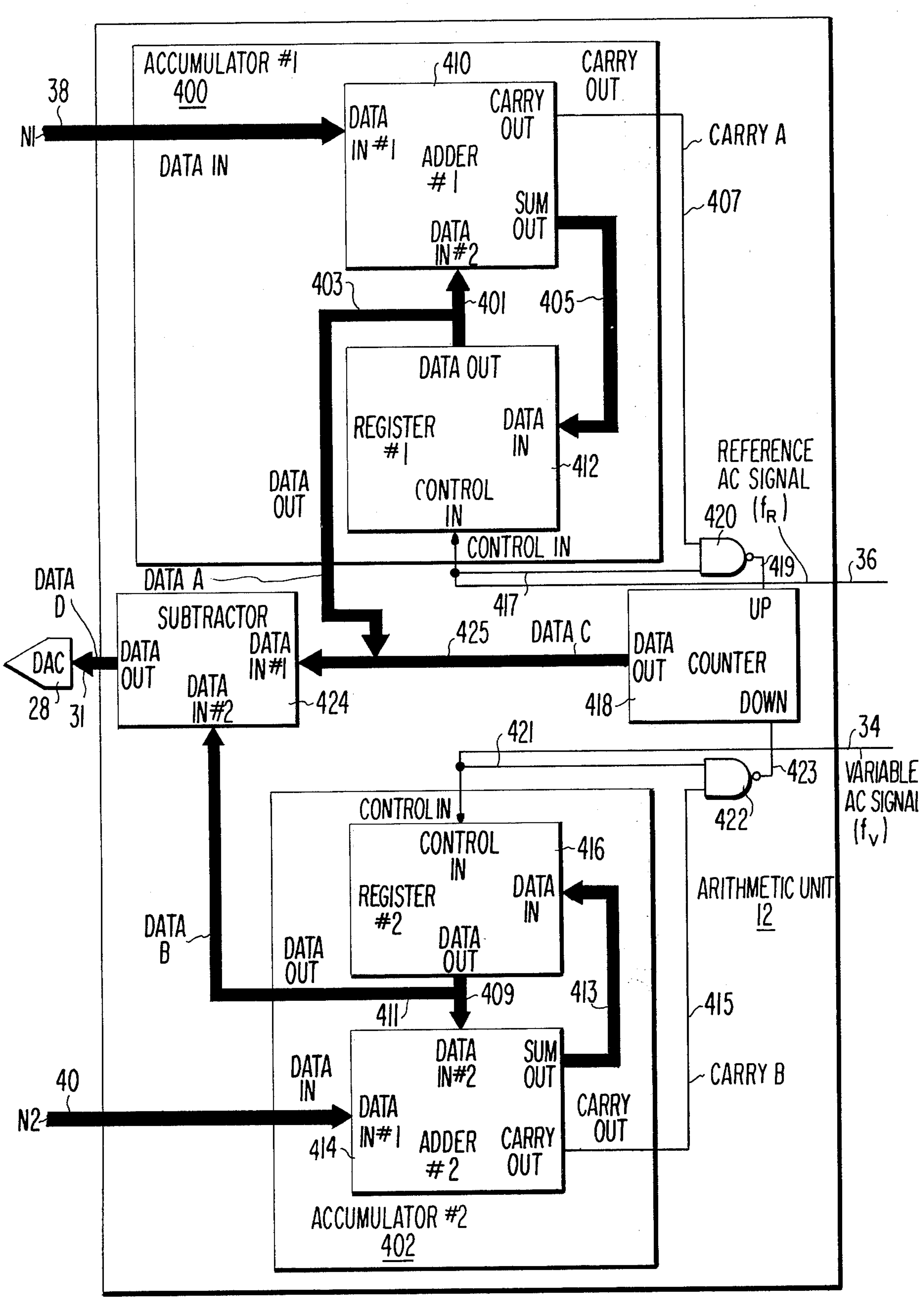
FIG. 4 is a logic diagram of a preferred implementation of the arithmetic unit of FIG. 1.

Arithmetic unit 12 is provided to perform algebraic additions of the number N1 to the contents of storage register 60, included within arithmetic unit 12, and algebraic subtractions of the number N2 from the contents of storage register 60 and includes a storage register 60 for accumulating the results of such arithmetic additions and subtractions. Arithmetic unit 12 may be formed by suitable logic circuits as is well known in the art. FIGS. 3 and 4, to be described later, illustrate several logic implementations of arithmetic unit 12.

It is preferred that both the reference AC signal and the variable AC signal, coupled respectively to the plus (+) and minus (−) inputs of arithmetic unit 12, have the form of pulse trains, which are compatible with the logic circuits forming arithmetic unit 12, rather than sine or cosine shaped signals or the like, which are not, in general, compatable with logic circuits. Arithmetic unit 12 is arranged to add the number N1 to the contents of the output storage register at every positive going edge of the reference AC signal, and to subtract the number N2 from the contents of the output storage register at every positive going edge of the variable AC signal. Alternatively, the arithmetic operation of arithmetic unit 12 may be clocked at the negative going edges of the variable AC signal and reference AC signal or at a predetermined voltage level. Thus, N1 is added to the contents of the storage register at a rate $f_R$ and N2 is subtracted to the contents of the storage register at a rate $f_V$.

Signals manifesting numbers N1 and N2 are respectively coupled to arithmetic unit 12 respectively from programming means 18 and 20. The signals manifesting the numbers N1 and N2 are preferrably digital signals formed of groups of parallel binary digits (bits). Therefore, it is preferred that arithmetic control unit 12 be of the type capable of adding and subtracting groups of parallel bits and storing the results of such arithmetic operation in parallel fashion.

It is preferred that arithmetic unit 12 include suitable logic, not shown, coupled to storage register 60 so that if storage register 60 has reached its capacity or maximum value, for instance, manifested by 1's in each bit position of storage register 60, the next addition will not result in a change in the contents which manifests a value lower than the maximun value. Similarly, it is preferred that arithmetic unit 12 include suitable logic, not shown, coupled to storage register 60 so that if storage register 60 has reached a minimum value, for instance, manifested by 0's in each bit position of storage register 60, the next subtraction will not result in a change in the contents which manifests a value higher than the minimum value. These preferences may be understood, and thereby appreciated, by considering the operation of storage register 60 without the logic described above. For example, if the contents of storage register 60 are 1 1 1 1 1 1 1 1 1 1 1, and the next arithmetic operation of arithmetic unit 12 is the addition of the binary number 0 0 0 0 0 0 0 0 0 0 1 to the contents of storage register 60, the results would normally be 0 0 0 0 0 0 0 0 0 0 0, which is the extreme opposite of 1 1 1 1 1 1 1 1 1 1 1. Thus, in effect, the operation of storage registers 60 would be unnatural to the extent that once they are saturated at a maximum value, further additions decrease rather than increase, the value manifested by the contents of the storage register; and once they are saturated at a minimum value, further subtractions increase, rather than decrease, the value manifested by the contents of the storage register. This type of change from one extreme value to the opposite extreme value (maximum to minimum or minimum to maximum) is preferably prevented so that phase locked loop 10 will not be subjected to sudden frequency changes in response to changes in the contents of storage register 60, which are unnatural and which tend to increase the time required for acquisition.

It should be noted that one way of preventing changes of contents of storage register 60 from one extreme value to the opposite extreme value is to provide logic for inhibiting further additions if storage register 60 contains a maximum value and logic for inhibiting further subtractions if storage register 60 contains a minimum value. Such logic is described with reference to FIG. 4.

The contents of the storage register 60 of arithmetic unit 12 are coupled, in parallel fashion, to the input of digital to analogue converter means 14, as the results of the arithmetic operations in arithmetic unit 12 are accumulated in storage register 60. Digital to analogue converter 14 comprises a digital to analogue converter (DAC) 28, connected in series, in the order named, with amplifier 30 and filter 32. It should be appreciated that the functions of amplifier 30 and filter 32 may be combined in the form of an active filter including an operational amplifier having a series connected R-C network in the feedback loop of the operational amplifier. As an example of such an active filter, see Motorola application note AN-535, entitled "Phase Locked Loop Fundamentals." Digital analogue converter 28 converts the contents of storage register 60 into a pulse train whose individual pulses have amplitudes varying in accordance with the contents of the storage register 60. Digital to analogue converters, responsive to digital signals comprising parallel bits, are well known in the art. The Datel Systems, Inc. type DAC 6912BI, described in the Datel System's 1974 short form catalog, is an example of such digital to analogue converters.

Figure 2:
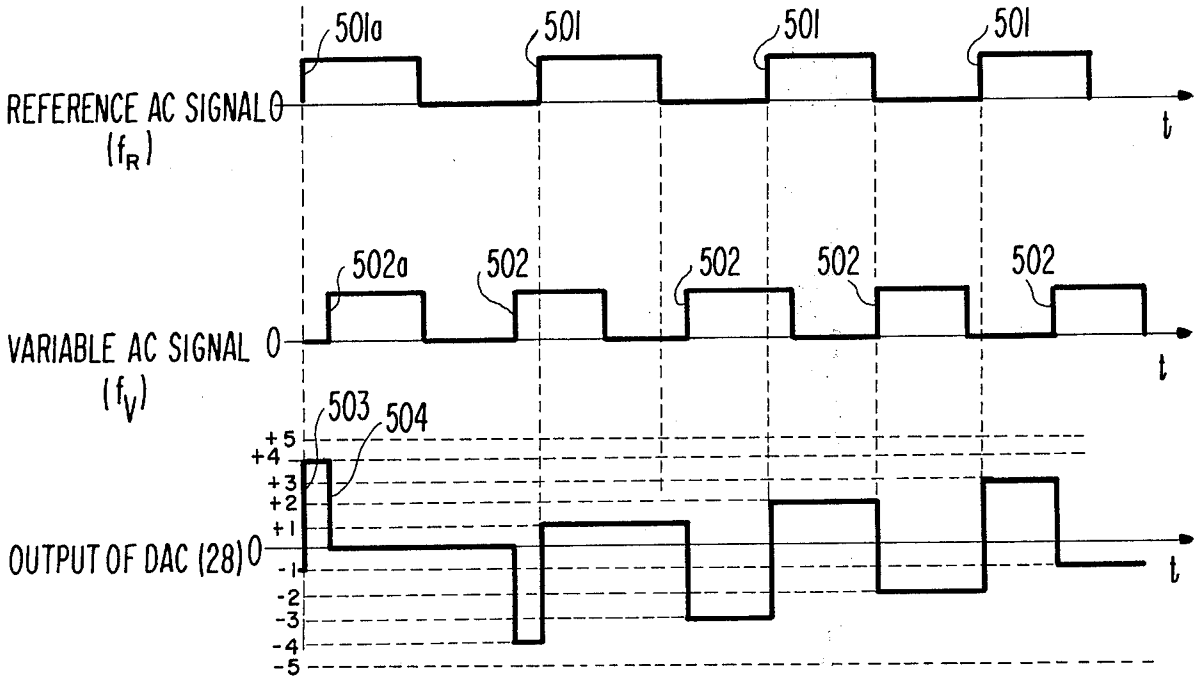
FIG. 2 is a graphical representation of certain signal waveforms useful in understanding the operation of the phase locked loop of FIG. 1.

FIG. 2 is a graphical representation of certain waveforms of phase locked loop 10 showing the relationship of the waveforms of the reference AC signal ($f_R$), the variable AC signal ($f_V$), and the output signal of digital to analogue converter 28. By way of example, assume that N1 equals 5 and N2 equals 4. Then, for each positive going edge 501 of the reference AC signal, the number 5 is added to the contents of storage register 60 and for each positive going edge 502 of the variable AC signal, the number 4 is subtracted from the contents of storage register 60. The output of digital to analogue converter 28 varies in response to the contents of storage register 60. Thus, as shown in FIG. 2, if it is assumed that before the first positive going edge **501*a* of the reference AC signal has occurred the contents of storage register 60 manifests the value −1, upon the occurrence of the first positive edge (501*a*) of the reference AC signal, the value manifested by the contents of storage register 60 changes from −1 to 4, as shown at edge 503 of the output signal. Thereafter, with the occurrence of the first positive going edge (502*a*) of the variable AC signal the value manifested by the contents of storage register 60 changes from 4 to 0, as shown at edge 504 of the output signal. This process continues, in a similar manner for each positive going edge 501 of the reference AC signal and each positive going edge 502 of the variable AC signal. It is noted that the output signal of digital to analogue converter 28** contains only harmonics of reference frequency $f_R$ and variable frequency $f_V$ and does not contain beat frequencies (frequencies equal to the sum or difference of reference frequency $f_R$ and variable frequency $f_V$).

The output of digital to analogue converter 28 is coupled through conductor 48 to amplifier 30 where it is amplified to a suitable level compatible with the operation of filter 32 and voltage controlled oscillator 22. The output of amplifier 30 is coupled through conductor 50 to filter 32 where it is filtered to generate an average DC voltage manifesting the contents of the storage register 60. Filter 32 is arranged to remove any AC components having frequency components other than $f_V$ and $f_R$ or the harmonics of $f_V$ and $f_R$ from the output of amplifier 30, while assuring stability. The output of filter 32 forms the DC control signal to control the frequency of the output of voltage controlled oscillator 22 in accordance with the contents of storage register 60, and is coupled through conductor 32 to voltage controlled oscillator 22. When the DC control signal from filter 32 reaches a stable level, as will be explained, the loop is locked.

It is to be noted that amplifier 30 may be an integrating amplifier to amplify and integrate the pulse train output of digital to analogue converter 30. If amplifier 30 is an integrating amplifier, the output of the amplifier on conductor 50 is an error signal manifesting the degree of departure the loop is from a locked condition. When the average of the error signal detected by filter 32 is zero, the loop is in a locked condition.

Programming units 18 and 20 are provided to allow the selection of the numbers N1 and N2. Programming units 18 and 20 may comprise suitable logic circuits for converting decimal numbers into respective binary numbers manifested by respective groups of parallel bits. Such logic circuits are well known in the art and may include a read only memory (ROM) circuit or the like. Alternatively, programming units 18 and 20 may be arranged so that the numbers N1 and N2 may be directly programmed in a binary code by providing suitable means for selectively placing either a binary 1 or 0 in each bit position of the group of bits manifesting N1 and N2.

In conjunction with programming units 18 and 20, sweep circuits 52 and 56, respectively coupled to programming units 18 and 20 by multiconductor paths 54 and 58, may be provided to change N1 or N2 or both in a predetermined manner in response to a predetermined control signal. For example, the control signal may linearly increase N1 from one value to a second, higher. value, so that the frequency of the output AC signal at terminal 28 linearly sweeps between two frequencies. Thus, phase locked loop 10 may be adapted to form a sweep generator. For this purpose, sweep circuit 52 or 56 or both may include a counter to linearly increment N1 or N2 or both, respectively. In another embodiment, sweep circuits 52 and 56 may be adapted to generate a signal to cause N1 or N2, or both, to change in accordance with an audio signal or the like, thereby causing the output Ac signal at terminal 28 to be frequency modulated.

The maximum magnitudes of the numbers N1 and N2 are limited by the number of bits in the groups of bits manifesting, respectively, N1 and N2. The number of bit positions in storage register 60 is accordingly determined by the maximum of the magnitudes of the numbers N1 and N2. For instance, if it is desired that the maximum magnitude of N1 ($N2_{max} = 2N1_{max}$), storage register 60 must have enough bit positions to accomodate a number at least three times the maximum magnitude of N1 ($3N1_{max}$). Since each bit position in a binary number, going from right to left, represents a successive multiplication by 2 (the bit positions in a binary number, going from right to left, are given weights of increasing powers of 2) storage register 60 must accomodate a number equal to an even multiple higher than the maximum sum of N1 and N2. Thus, if the maximum sum of N1 and N2 is $3N1_{max}$, it is desirable that storage register 60 have enough bit positions to accomodate $4N1_{max}$, or, two more bit positions than are provided for the number N1. Therefore, in FIG. 1, since the maximum magnitude of N1 and N2 is limited in the illustration by ten bit positions (as indicated by 10 conductors in multiconductor paths 38 and 40 respectively), and it is desired that $N2_{max} = 2N1_{max}$, 12 bit positions are provided for in storage register 60 (as indicated by twelve conductors in multiconductor path 31).

ARITHMETIC UNIT OF FIG. 3

FIG. 3 is a logic diagram of a logic implementation of arithmetic unit 12. In FIG. 3, arithmetic unit 12 comprises arithmetic logic unit (ALU No. 1) 210, arithmetic logic unit (ALU No. 2) 212, and register 214. Arithmetic logic units No. 1 and No. 2 are commercially available digital arithmetic units which are capable of parallel addition of binary numbers or parallel subtraction of binary numbers, when suitably connected to perform the respective functions, and parallel storage and transfer of the results of the arithmetic operations. Arithmetic logic units No. 1 and No. 2 may, for instance, comprise Arithmetic Logic Unit/Function Generator type SN54181 integrated circuit, available from Texas Instruments and described in the Texas Instruments' TTL Catalog Supplement (Mar. 15, 1970), pages S7-1 to S7-11. Register 214 is a storage register for receiving, storing, and transferring out binary data in parallel fashion in response to a digital control signal. Such registers are well known and are commercially available. For example, Quadruple D-Type Edge Triggered Flip-Flop type N74175, manufactured by Signetics and described in the Signetics 1972 Integrated Circuit Catalog, serves suitably as register 214.

Arithmetic logic units No. 1 and No. 2 each have a control input (CONTROL IN), first (DATA IN No. 1), and second (DATA IN No. 2) data inputs and a data output (DATA OUT). Both arithmetic logic units No. 1 and No. 2 receive, arithmetically operate on, and transfer data out in parallel fashion in response to a digital control signal. Arithmetic logic unit No. 1 210 will arithmetically add the data at DATA IN No. 1 to the data at DATA IN No. 2 in response to the proper logic signal at CONTROL IN. Similarly, arithmetic logic unit No. 2 will subtract the data at DATA IN No. 1 from the data at DATA IN No. 2 in response to an appropriate logic signal at the CONTROL IN. The contents of unit 210 will be transferred out from unit 212 through DATA OUT in response to the appropriate logic signal at the CONTROL IN of Unit 210. Similarly, the contents of unit 212 will be transferred out from unit 212 through its DATA OUT in response to the appropriate logic signal at its CONTROL IN. Data will be transferred in to register 214 through its DATA IN and stored in response to the appropriate logic signal of its CONTROL IN through OR gate 216 and transferred out of register 214 through its DATA OUT in response to the appropriate logic signal at its CONTROL IN. The logical conditions for the operation of unit 210, unit 212 and register 214 will be described in the description to follow of the operation of this form of arithmetic unit 12.

Reference AC signal ($f_R$) is coupled to CONTROL IN of unit 210 through conductor 36 and one input of OR gate 216 through conductor 224. The variable AC signal ($f_V$) is coupled to CONTROL IN unit 212 through conductor 34 and the second input of OR gate 216 through conductor 226. The output of OR gate 216 is connected to CONTROL IN of register 214 through conductor 218.

Multiconductor path 38, carrying the group of parallel bits manifesting N1, is coupled to DATA IN No. 1 of unit 210. While DATA OUT is coupled through multiconductor path 220 to DATA IN No. 2 of unit 212 to conduct the results of the arithmetic additions in unit 210 to unit 212. Multiconductor 40, carrying the group of parallel bits manifesting the N2, is coupled to DATA IN No. 1 of unit 212. The results of the arithmetic subtractions therein are coupled from DATA OUT of unit 212 through multiconductor path 31 to digital to analogue converter (DAC) 28 and through multiconductor path 228 to DATA IN of register 214. Data is transferred out of register 214 through DATA OUT of register 214 to DATA IN No. 2 of unit 210 through multiconductor path 222.

The operation of the logic shown in FIG. 3 to perform the function of arithmetic unit 12 will be best understood with reference to the truth table appearing below. In the truth table, for illustrative purposes, the symbols H and L stand for a logic high and a logic low, respectively. The logic implementation selected, of course, will determine which logic symbol is used for logic 1 or 0. It should be also appreciated that these logic levels may correspond to either a particular voltage level or a particular edge of a pulse in an appropriate pulse train (the variable AC signal ($f_V$) or the reference AC signal ($f_R$)). It should become apparent from an examination of the truth table that, in essence, unit 212 functions not only to perform arithmetic subtractions, but also functions as storage register 60 of arithmetic unit 12 of FIG. 1. From an examination of the following truth table, it should also become apparent that arithmetic unit 12 is arranged so that number N1 is added to the contents of ALU No. 2 at a rate equal to the reference frequency $f_R$ while the number N2 is subtracted from the contents of ALU No. 2 at a rate equal to the variable frequency $f_V$ and that the results of the arithmetic additions and subtractions are transferred to the input of digital to analog converter 28.

TRUTH TABLE FOR THE LOGIC OF FIGURE 3

| SIGNALS | | OPERATIONS | | |
|---|---|---|---|---|
| REFERENCE AC ($f_R$) | VARIABLE AC ($f_V$) | ALU No. 1 (Unit 210) | ALU No. 2 (Unit 212) | REGISTER (214) |
| H | L | adds data at DATA IN No. 1 and DATA IN No. 2 | contents transferred out to REGISTER | contents of ALU No. 2 entered and stored |
| L | H | contents trans-ferred out to ALU No. 2 | subtracts data at DATA IN No. 1 from data at DATA IN No. 2 | contents of ALU No. 2 entered and stored |
| H | H | adds data at DATA IN No. 1 and DATA IN No. 2 | subtracts data at DATA IN No. 1 from data at DATA IN No. 2 | contents of ALU No. 2 entered and stored |

TRUTH TABLE FOR THE LOGIC OF FIGURE 3—Continued

| SIGNALS REFERENCE AC ($f_R$) | VARIABLE AC ($f_V$) | OPERATIONS ALU No. 1 (Unit 210) | ALU No. 2 (Unit 212) | REGISTER (214) |
|---|---|---|---|---|
| L | L | contents transferred to ALU No. 2 | contents transferred to REGISTER | contents transferred to ALU No. 1 |

ARITHMETIC UNIT OF FIG. 4

Reference is now made to FIG. 4, which is a logic diagram of a preferred logic implementation of arithmetic unit 12. In FIG. 4, arithmetic unit 12 is formed by accumulator No. 1 400, including adder No. 1 410 and register No. 1 412, accumulator No. 2 402, including adder No. 2 414 and register No. 2 416, counter 418 and subtractor 424.

Adder 410 and adder 414 are suitable binary adders for adding binary numbers in parallel fashion to generate a sum signal and a carry out signal. For example, adder 410 and adder 416 may be formed by cascading four-bit binary full adders such as type SN7483, available from Texas Instruments and described in the "Integrated Circuits Catalogue for Design Engineers," first edition, pages 9-271 to 9-278. Adder 410 and adder 414 each have two data inputs DATA IN No. 1 and DATA IN No. 2, an output for the sum signal, SUM OUT, and an output for the carry signal, CARRY OUT.

Register 412 and register 416 are suitable binary storage registers for receiving, storing and transferring out data in parallel fashion in response to a control signal coupled to the control input of the registers. For example, register 412 and register 416 may be formed by suitably connected four-bit shift-right/shift-left registers, such as type SN7495A, available from Texas Instruments and described in the "Integrated Circuits Catalogue for Design Engineers" first edition pages 973 to 9-78. For this type of register, data is transferred in response to a negative going edge of each pulse of a pulse train forming the control signal. Register 412 and register 416, it is noted, as indicated above, each have a control input, CONTROL IN, a data input, DATA IN, and a data output, DATA OUT.

Accumulator 400 and accumulator 402 each have a control input, CONTROL IN, a data input, DATA IN, a data output, DATA OUT, and a carry output, CARRY OUT. The signal manifesting N1 is coupled to DATA IN of accumulator 400 and to DATA IN No. 1 of adder 410 by multiconductor path 38. DATA OUT of register 412 is coupled by multiconductor path 401 to DATA IN No. 2 of adder 410. DATA OUT of register 412 is also coupled to DATA OUT of accumulator 400 by multiconductor path 403. SUM OUT of adder 410 is coupled to DATA IN of register 412 by multiconductor path 405. Conductor 36, carrying the reference AC signal ($f_R$), is connected to CONTROL IN of accumulator 400 and to CONTROL IN of register 412. CARRY OUT of adder 410 is connected to CARRY OUT of accumulator 400 by conductor 407.

The signal manifesting N2 is coupled to DATA IN of accumulator 402 and to DATA IN No. 1 of adder 414 by multiconductor path 40. DATA OUT of register 416 is coupled by multiconductor path 409 to DATA IN No. 2 of adder 414. DATA OUT of register 416 is also coupled to DATA OUT of accumulator 402 by multiconductor path 411. SUM OUT of adder 414 is coupled to DATA IN of register 416 by multiconductor path 413. Conductor 34, carrying the variable AC signal ($f_V$), is connected through CONTROL IN of accumulator 402 and then to CONTROL IN of register 416. CARRY OUT of adder 414 is connected to CARRY OUT of accumulator 402 by conductor 415.

Accumulator 400 is arranged to arithmetically add the signal manifesting N1 at DATA IN to the contents of register 412 at each negative going edge of the reference AC signal ($f_R$). Accumulator 402 is arranged to arithmetically add the signal manifesting N2 at DATA IN to the contents of register 416 at each negative going edge of the variable AC signal ($f_V$).

The CARRY A signal, generated at CARRY OUT of accumulator 400 by adder No. 1 410, is conducted by conductor 407 to one input of NAND gate 420. The other input of NAND gate 420 is connected to conductor 36, carrying the reference AC signal 1, by conductor 417. The output of NAND gate 420 is conducted to the UP input of counter 418 by conductor 419.

The CARRY B signal, generated at CARRY OUT of accumulator 402 by adder 414, is conducted by conductor 415 to one input of NAND gate 422. The other input of NAND gate 422 is connected to conductor 34, carrying the variable AC signal ($f_V$), by conductor 421. The output of NAND gate 422 is conducted to the DOWN input of counter 418 by conductor 423.

Counter 418 is a suitable binary counter such that the contents thereof are incremented by a binary 1 at each positive going edge of the signal at the UP input, except when the contents have reached a maximum value, and decremented by a binary 1 at each positive going edge of the signal at the DOWN input, except when the contents have reached a minimum value. The commercially available Phase Frequency Detector unit, type MC12040, manufactured by Motorola and described in the "Phase Locked Loop Systems Data Book," second edition, pages 38–41, may serve as a suitable counter 418. Thus, whenever the CARRY A signal and the reference AC signal are a logical high, the contents of counter 418 will be incremented by a binary 1, except when the contents of counter 418 have a maximum value, and whenever the CARRY B signal and the variable AC signal are a logical high, the contents of counter 418 will be decremented by a binary 1 except when the contents of counter 418 have a minimum value.

Subtractor 424 has two data inputs, DATA IN No. 1, DATA IN No. 2, and a data output, DATA OUT, being arranged to arithmetically subtract the data at DATA IN No. 2 from the data at DATA IN No. 1 and to couple the results of this subtraction to DATA OUT in parallel fashion. Since subtraction is equivalent to two's complement addition as is well known, an adder similar to adder 410 and adder 414 may serve to form subtractor 424.

The contents of counter 418 (the DATA C signal) are coupled by multiconductor path 425 in parallel fashion to DATA IN No. 1 of subtractor 424 and forms the most significant bits (MSB) of the data at DATA IN No. 1. The data at DATA OUT Of accumulator 400 (the DATA A signal) is coupled by multiconductor path 403 to DATA No. 1 of subtractor 424 and forms the least significant bits (LSB) of the data at DATA IN No. 1. The data at DATA OUT of accumulator 402 (the DATA B signal) is coupled through multiconductor path 411 to DATA IN No. 2 of subtractor 424. The results of the arithmetic subtractions in subtractor 424 (the DATA D signal) are coupled from DATA OUT of subtractor 424 by multiconductor path 31 to digital to analogue converter 28. It should be noted from the following description of the operation of the logic of FIG. 5 which follows that, in essence, subtractor 424 performs the function of storage register 60 of FIG. 1.

The operation of the logic shown in FIG. 4 to perform the function of arithmetic unit 12, as previously described, will be best understood with reference to the two truth tables appearing below. In the truth tables, the symbols H and L stand for a logic high and a logic low, respectively, and it should be appreciated that these logic levels are selected in accordance with the chosen logic devices and may correspond to either a particular voltage level or a particular edge of a pulse in an appropriate pulse train (the variable AC signal or the reference AC signal).

TRUTH TABLE FOR ARITHMETIC UNIT 12 OF FIGURE 4

| REF. AC SIGNAL ($V_R$) | VAR. AC SIGNAL ($V_F$) | ACCUMULATOR No. 1 (400) | ACCUMULATOR No. 2 (402) | SUBTRACTOR (424) |
|---|---|---|---|---|
| H | L | DATA A incremented by N1 | No change | DATA D incremented by N1 |
| L | H | No change | DATA B incremented by N2 | DATA D decremented by N2 |
| H | H | DATA A incremented by N1 | DATA B incremented by N2 | DATA D changed by (N1–N2) |
| L | L | No change | No change | No change |

TRUTH TABLE FOR COUNTER 418 OF FIGURE 4

| UP | DOWN | OLD DATA C | NEW DATA C |
|---|---|---|---|
| L | L | C | C |
| L | H | >MIN | C–1 |
| L | H | MIN | MIN |
| H | L | <MAX | C+1 |
| H | L | MAX | MAX |
| H | H | C | C |

It should be apparent from the two truth tables that if the loop is in an unlocked condition wherein the variable AC frequency $f_V$ is lower than the programmed frequency, DATA C reaches the maximum value of all 1's and then remains constant. However, DATA A will continue to change at every negative going edge of the reference AC signal ($f_R$) with the result that DATA D will continue to change. Since the most significant bits (MSB) of the DATA D signal are binary 1's, the output of digital to analogue converter 28 has an average positive DC component which will tend to increase variable frequency $f_V$. Similarly, when the loop is in an unlocked condition wherein the variable Ac frequency $f_V$ is higher than the programmed frequency, DATA C reaches the minimum value of all 0's and then remains constant. However, DATA B will continue to change with the result that DATA D will continue to change. Since the most significant bits DATA D are all 0's, the output of digital to analogue converter 28 will have an average negative DC component which tends to decrease the variable frequency $f_V$.

OPERATION OF PHASE LOCKED LOOP (10) — FIG. 1

Figure 5:
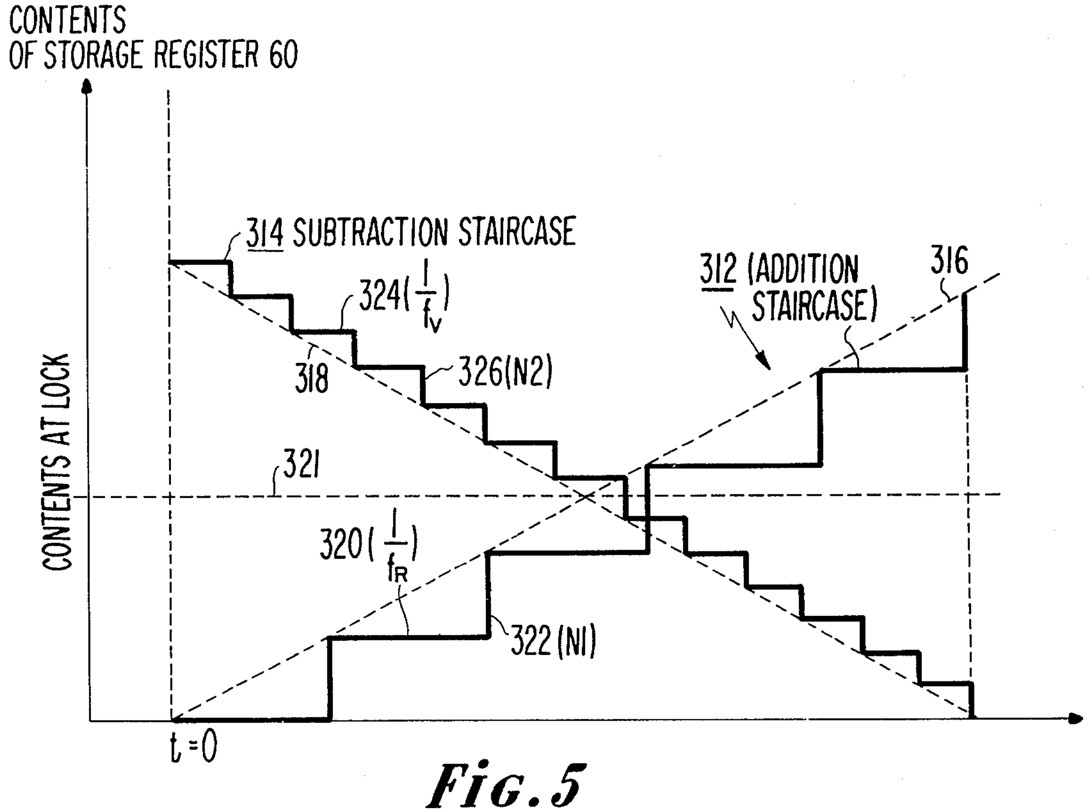
FIG. 5 is a timing diagram useful in understanding the operation of the phase locked loop of FIG. 1.

The overall operation of phase locked loop 1 0 of FIG. 1 will now be described and may be better understood by further reference to the timing diagram of FIG. 5. For each pulse of the reference AC signal ($f_R$), a number N1 is added to the contents of storage register 60 of the arithmetic unit 12. These additions are indicated in FIG. 5 by positive-going addition staircase waveform 312. Similarly, for each pulse of the variable AC signal ($f_V$), N2 is subtracted from the contents of storage register 60. These subtractions are indicated by negative-going subtraction staircase waveform 314. Horizontal portions 320 of the steps of addition staircase waveform 312 represent the time intervals, $$\frac{1}{f_R},$$

between additions, while vertical portions 322 represent the magnitude of the additions, N1. Similarly, horizontal portions 324 of the steps of subtraction waveform 314 represent the time intervals, $$\frac{1}{f_V},$$

between subtractions, while vertical portions 326 of the step of subtraction waveform 314 represent the magnitude of the subtractions, N2. The addition and subtraction staircase waveforms have, respectfully, an average positive slope 316 and an average negative slope 318.

Phase locked loop 10 is locked to a programmed or desired frequency when the frequency of VCO 22 no longer changes. Since the frequency of VCO 22 is controlled by the DC control voltage from analogue converter means 14 in response to the contents of storage register 60, the frequency of VCO 22 will no longer change when the DC control signal reaches a substantially stable level in response to substantially constant contents of storage register 60. Thus, constant value in storage register 60 indicates that the total number of additions over a period of time equals the total number of subtractions over the same period of time.

Since the contents of storage register 60 may be considered as the difference between addition staircase waveform 316 and subtraction staircase waveform 314, a constant value in storage register 60 may thereby be graphically represented by a horizontal line 321 in FIG. 5. Thus, if the difference between sloped lines 316 and 318 is a horizontal line 312, phase locked loop 10 will be locked on the chosen or programmed frequency. This requires that the average slope 318 of subtraction staircase waveform 314 be equal in magnitude but opposite in sign to the average slope 316 of addition staircase waveform 312. This in turn requires that the ratio of vertical portion 322 to horizontal portion 320 addition staircase waveform 312 be equal to the ratio of vertical portion 326 to horizontal portion 324 to subtraction staircase waveform 314. Symbolically, this condition for lock may be represented by the equation $$\frac{1/f_R}{N1} = \frac{1/f_V}{N2} \quad (1)$$

Solving equation (1) for $f_V$ yields $$f_V = \frac{N1}{N2} f_R$$

Equation (1) indicates that the total number of addition per unit time of the number N1 must be equal to the total number of subtractions of N2 over the same unit of time in order to achieve a lock condition. Thus, phase locked loop 10 may be programmed at fractional increments of the reference frequency.

it is to be noted that although phase locked loop 10 will always precisely lock on the correct programmed frequency, the phase relationship between the reference AC signal ($f_R$) and the variable Ac signal ($f_V$) will not generally be predictable since the initial contents of storage register 60 are not generally known and the loop 10 will lock whenever the total number of additions to the initial contents of storage register 60 equals the total number of subtractions from the initial contents of storage register 60 over a period of time. That is, when variable frequency $f_V$ equals $$\frac{N1}{N2} f_R$$

the levels at the output of digital to analogue converter 28 (see OUTPUT OF DAC (28) waveform in FIG. 2) will repeat in a given sequence, however, a shift in the delay of the variable AC signal (as indicated by a leftward or rightward shift of the VARIABLE AC SIGNAL of FIG. 2 or the subtraction staircase 314 of FIG. 5) causes the average DC component of the output of digital to analogue means 14 to change according to this phase shift. Thus, in essence, arithmetic unit 60 in conjunction with digital to analogue converter circuit 14, is phase sensitive.

It should now be understood that a phase locked loop has been described which may be programmed in discrete increments equal to fractions of the reference frequency. It should also be understood that the phase locked loop described herein has an upper frequency limit essentially determined only by the switching speed of the logic elements used therein, since the logic operates at the rate of the reference frequency and the phase locked loop does not contain nor require a programmable frequency divider whose frequency limitation limits the frequency capability of the loop itself. Additionally, the present locked loop has a relatively wide acquisition range and does not require the use of "pretuning circuits," a "search oscillator," or the like used in conventional phase locked loops to compensate for the limited acquisition range resulting from the use of a narrow bandwidth loop filter required to filter unwanted frequencies. Further, since beat frequencies are not produced by the phase locked loop, means for suppressing beat frequencies are not required.

What I claim is:

1. The combination comprising: 1 first means for providing a first digital signal representing a number N1;

second means for providing a second digital signal representing a number N2;

third means for providing a third digital signal having a reference frequency $f_R$;

fourth means for providing a fourth digital signal having a variable frequency $f_V$;

arithmetic means, including storage means for storing a digital sum signal representing the results of arithmetic operations, said arithmetic means being responsive to said first, second, third and fourth digital signals for adding said number N1 to the contents of said storage means at a frequency $f_R$ and subtracting said number N2 from the contents of said storage means at a frequency $f_V$ to thereby generate said sum signal;

said fourth means further comprising a variable frequency means responsive to said sum signal for generating said fourth digital signal, said frequency $f_V$ of said fourth digital signal varying in accordance with the contents of said storage means; and output means coupled to said variable frequency means for generating an output signal having a frequency directly proportional to said frequency $f_V$;

the contents of said storage means remaining substantially constant when the total of the additions of N1 in a unit of time equals the total of the subtractions of N2 in said unit of time, said frequency $f_V$ being directly proportional to $$\frac{N1}{N2} f_R$$

when said contents of said storage means are substantially constant.

2. The combination comprising:

first means for providing a first digital signal representing a number N1;

second means for providing a second digital signal representing a number N2;

third means for providing a third digital signal having a reference frequency $f_R$;

fourth means for providing a fourth digital signal having a variable frequency $f_V$;

arithmetic means, including storage register means for storing a digital sum signal representing the results of arithmetic operations, said arithmetic means being responsive to said first, second, third and fourth digital signals for adding said number N1 to the contents of said storage register means at said frequency $f_R$ and subtracting said number N2 from the contents of said storage register means at said frequency $f_V$ to thereby generate said digital sum signal;

digital to analogue converter means responsive to said digital sum signal for generating a DC control signal varying in accordance with said digital sum signal;

said fourth means further comprising an oscillator means responsive to said DC control signal for generating said fourth digital signal, said frequency $f_V$ of said fourth digital signal varying in accordance with said DC signal; and output means coupled to said oscillator means for generating an output AC signal having a frequency directly proportional to said frequency $f_V$;

the contents of said storage register means remaining substantially constant when the total of the additions of N1 in a unit of time equals the total of the subtractions of N2 in said unit of time, said frequency $f_V$ being directly proportional to $$\frac{N1}{N2} f_R$$

when said contents of said storage register means are substantially constant.

3. The combination recited in claim 2 further including programming means for selectively changing the value of N1.

4. The combination recited in claim 3 further including programming means for selectively changing the value of N2.

5. The combination recited in claim 4 further including means for selecting controlling the value of N1 in response to a first control signal and controlling the value of N2 in response to a second control signal.

6. The combination recited in claim 5 wherein said first control signal periodically sweeps N1 between a first value and a second value, whereby the frequency $f_V$ is periodically swept between a first and a second frequency.

7. The combination recited in claim 5 wherein said output AC signal is frequencey modulated according to said first and second control signals.

8. The combination recited in claim 4, wherein said first digital signal, said second digital signal and said digital sum signal comprise rspective first, second and third groups of binary digits, said arithmetic means being arranged to simultaneously receive the binary digits in said first group and to simultaneously receive the binary digits in said second group, said storage register means being arranged to simultaneously store the binary digits in said third group, said arithmetic means being arranged to add said first group to the contents of said storage register means and to subtract said second group from the contents of said storage register means, said digital to analogue means being arranged to receive said third group of binary digits and to convert said third group to said DC control signal.

9. The combination recited in claim 8 including means to prevent additions of said number N1 from decreasing the value manifested by the contents of said storage register and to prevent subtractions of said number N2 from increasing the value manifested by the contents of said storage register.

10. The combination recited in claim 9, wherein said oscillator means includes an oscillator responsive to said Dc control signal to generate an oscillator output AC signal having a frequency $Kf_V$, wherein K is a predetermined number; a power splitter responsive to said oscillator output AC signal to couple a first portion of said oscillator output AC signal to said output means; said power splitter coupling a second portion of said oscillator output AC signal to a frequency divider, said frequency divider thereby dividing the frequency of said second portion of said oscillator output AC signal by said number K to thereby generate said fourth digital signal.

11. The combination recited in claim 8 wherein said frequency divider is a digital counter.

12. The combination recited in claim 11, wherein said oscillator is a voltage controlled oscillator and said digital to analogue converter means is adapted to generate a voltage varying in accordance to the contents of said output register means.

13. The combination recited in claim 11, wherein said digital to analogue converter means includes a digital to analogue converter coupled to said output register means to convert the contents of said output register into a pulse train having pulses whose amplitude varies in accordance with the contents of said output register means; and means responsive to said pulse train for generating the average value of said pulse train to thereby form said DC control signal.

14. The combination recited in claim 13, wherein said means for averaging said pulse train includes an amplifier and a filter coupled in series, in the order named, between said digital to analogue converter and said oscillator.

15. The combination recited in claim 14, wherein said amplifier is an integrating amplifier arranged to integrate said pulse train.

16. The combination comprising:

first means for providing a first digital signal representing a first number, second means for providing a second digital signal representing a second number;

third means for providing a third digital signal having a first frequency;

fourth means for providing a fourth digital signal having a second frequency, said second frequency being variable;

arithmetic means, including storage means for storing a digital sum signal representing the results of arithmetic operations, said arithmetic means being responsive to said first, second, third and fourth digital signals for adding one of said numbers to the contents of said storage means at one of said first and second frequencies and for subtracting the other of said numbers from the contents of said storage means at the other of said first and second frequencies; and said fourth means further comprising a variable frequency means responsive to said sum signal for generating said fourth digital signal, said frequency of said fourth digital signal varying in accordance with the contents of said storage means.

* * * * *